(12) United States Patent
Kondo et al.

(10) Patent No.: US 6,633,134 B1
(45) Date of Patent: Oct. 14, 2003

(54) ACTIVE-MATRIX-DRIVEN ORGANIC EL DISPLAY DEVICE

(75) Inventors: Yuji Kondo, Tokyo (JP); Atsushi Kota, Tokyo (JP)

(73) Assignee: NEC Corporation (JP)

( * ) Notice: Subject to any disclaimer, the term of this patent is extended or adjusted under 35 U.S.C. 154(b) by 304 days.

(21) Appl. No.: 09/669,129

(22) Filed: Sep. 25, 2000

(30) Foreign Application Priority Data

Sep. 27, 1999 (JP) .......................................... 11-272758

(51) Int. Cl.[7] .................................................. G09G 3/10
(52) U.S. Cl. ...................... 315/169.3; 313/504; 313/506
(58) Field of Search .......................... 315/169.1, 169.3, 315/169.4; 313/500, 505, 506, 519, 504, 498; 345/76, 82, 84; G09G 3/10

(56) References Cited

U.S. PATENT DOCUMENTS

| 4,757,235 A | * | 7/1988 | Nunomura et al. ......... 313/506 |
| 5,644,327 A | * | 7/1997 | Onyskevych et al. ....... 313/503 |
| 5,739,800 A | * | 4/1998 | Lebby et al. ................. 345/82 |
| 5,818,404 A | * | 10/1998 | Lebby et al. ................. 345/82 |
| 6,072,450 A | * | 6/2000 | Yamada et al. ............. 313/500 |
| 6,084,579 A | * | 7/2000 | Hirano ....................... 315/169.3 |
| 6,201,346 B1 | * | 3/2001 | Kusaka ........................ 313/504 |
| 6,218,784 B1 | * | 4/2001 | Jang et al. ................... 313/257 |
| 6,274,978 B1 | * | 8/2001 | Roach et al. ................ 313/483 |
| 6,280,559 B1 | * | 8/2001 | Terada et al. ................ 156/150 |
| 6,307,324 B1 | * | 10/2001 | Hirano et al. ............ 315/169.3 |

FOREIGN PATENT DOCUMENTS

| JP | 59-116779 | 7/1984 | ............. G09F/9/33 |
| JP | 03-105326 | 2/1991 | ............ G02F/1/163 |
| JP | 4-31299 | 3/1992 | ............ H05B/33/26 |
| JP | 06-013180 | 1/1994 | ............ H05B/33/06 |
| JP | 07-006875 | 1/1995 | ............ H05B/33/14 |
| JP | 8-234683 | 9/1996 | ............. G09F/9/30 |
| JP | 11-126691 | 5/1999 | ............ H05B/33/26 |

* cited by examiner

*Primary Examiner*—Don Wong
*Assistant Examiner*—Trinh Do Dinh
(74) *Attorney, Agent, or Firm*—Hayes Soloway P.C.

(57) ABSTRACT

Each unit pixel of an active-matrix-driven organic EL display device includes a pixel EL element and an associated pixel circuit. An array of the pixel EL elements are formed on the front surface of a multilayer substrate, the rear surface of which mounts thereon a drive IC and the plurality of pixel circuits. The electrodes of the drive IC are connected to the anode and cathodes of the pixel EL elements through via holes and interconnects formed in the multilayer substrate.

8 Claims, 6 Drawing Sheets

ACTIVE-MATRIX-DRIVEN ORGANIC EL DISPLAY DEVICE

BACKGROUND OF THE INVENTION (a) Field of the Invention

The present invention relates to an active-matrix-driven organic electroluminescence (EL) display device and, more particularly, to such an organic EL display device having a multilayer substrate.

(b) Description of Related Art

Recently, active-matrix-driven organic EL display devices are intensively developed. The active-matrix-driven organic EL display device has a plurality of unit pixels arranged in a two-dimensional array on a supporting substrate for utilizing the EL phenomenon in an organic thin film.

FIG. 1 shows an equivalent circuit diagram of a general active-matrix-driven organic EL display device (hereinafter referred to as simply organic EL display device) such as described in JP Patent Publication No. 8-234683. The organic EL display device includes a plurality of unit pixels 50 each having first and second TFTs 56 and 57 and a storage capacitor 58, a plurality of data lines 54 each disposed for the unit pixels 50 arranged in a column direction (Y-direction) and a plurality of scan lines 53 each disposed for the unit pixels 50 arranged in a row direction (X-direction). Each scan line 53 is supplied with scan signals by a scan driver (Y-driver) 51 and connected to gates of the first TFTs 56 in the unit pixels 50. Each data line 54 is supplied with data signals by a data driver (X-driver) 52 and connected to the drain of the first TFT 56 in each of the unit pixels 50. The source of the first TFT 56 is connected to the gate of the second TFT 57 and a first terminal of the storage capacitor 58 which has a second terminal connected to the ground. The drain of the second TFT 57 is connected to a cathode of an organic EL element or pixel EL element 41, the anode of which is connected to a common source line.

FIG. 2 shows a cross section of the unit pixel 50 in a conventional organic EL display device such as shown in FIG. 1. The unit pixel 50 includes a glass substrate 64, and a p-type active Si (p-Si) film 61 implementing source/drain regions, a gate insulator film 62, and a gate electrode 65, which are consecutively formed on the glass substrate 64 to configure the second TFT. Source and drain electrodes 63 are formed on the gate insulator film 62 and connected to the active p-Si film 61 through via holes. The unit pixel 50 also includes a planarization (insulator) film 66 covering the TFTs, and an organic EL element or pixel EL element including an anode 68 made of ITO, an organic thin film 91 and a cathode 92, which are consecutively formed on the planarization film 66. The anode 68 is connected to the source of the second TFT. It is to be noted that the first TFT, the storage capacitor and other interconnects (not depicted) are also formed overlying the glass substrate 64.

FIG. 3 shows another conventional organic EL display device in cross section, and FIG. 4 shows a schematic perspective view thereof. This type of organic EL display device is described in a JP Utility Model Publication No. 4-31299. In the organic EL display device, an EL panel 110 mounting thereon organic EL elements and a TFT panel 120 mounting thereon TFTs, storage capacitors and interconnects are bonded together, with the electrodes of the EL panel 110 and the corresponding electrodes of the TFT panel 120 being connected by metallic bumps 136

The EL panel 110 includes an EL substrate 111, and a transparent anode 112, a first insulator film 113, a ZnS luminescent film 114, a second insulator film 115 and a metallic cathode 116, which are consecutively formed on the EL substrate 111. The TFT panel 120 includes an EL substrate 121, and a gate electrode 122, a gate insulator film 123, an amorphous Si (a-Si) film 124 and a channel protective film 125, which are consecutively formed on the TFT substrate 111. Source electrode 130 and drain electrode 131 are also formed on the TFT substrate 121. In FIG. 4, the TFT panel 120 mounts thereon the EL panel 110. The can terminals 132 for the scan lines 53 are disposed at both the sides of the TFT panel 121, whereas data terminals 133 for the data lines 54 are disposed at both the top and bottom of the TFT panel 121. Ground terminals 134 and anode terminals 135 for the transparent electrode (anode) are disposed at the corner areas of the TFT panel 121.

In the conventional organic EL display devices, the screen size of the display device substantially defines the size of the glass substrate 111. Thus, a larger-screen display panel necessitates employment of a larger glass substrate, on which TFTs are fabricated. A larger glass substrate requires a larger fabrication facility including deposition and exposure systems and raises the fabrication costs for the organic EL display device. In addition, the large, number of unit pixels, formed on the large glass substrate etc., suffer from a lower ratio of the number of non-defective products to the number of total products due to the irregularities on the large glass substrate in the fabrication process.

SUMMARY OF THE INVENTION

It is therefore an object of the present invention to provide an active-matrix-driven organic EL display device which is capable of reducing the dimensions of the substrate on which TFTs are fabricated as well as reducing the fabrication costs therefor by raising the ratio of the number of non-defective products to the number of total products.

The present invention provides an active-matrix-driven organic electroluminescence (EL) display device including first and second substrates, a plurality of unit pixels each including a pixel EL element and a pixel circuit, the pixel EL elements being arranged in a matrix on a front surface of the first substrate, a plurality of scan lines each disposed for a corresponding row of the unit pixels, a plurality of data lines each disposed for a corresponding column of the unit pixels, a drive circuit for driving the scan lines and the data lines to activate the pixel EL elements through respective the pixel circuits, the second substrate mounting thereon the drive circuit, the scan lines, the data lines and the pixel circuits, the first substrate mounting thereon the second substrate at a rear surface of the first substrate.

In accordance with the organic EL display device of the present invention, since the pixel circuit for driving a corresponding pixel EL element of a unit pixel is disposed outside the pixel area, the dimensions of the substrate mounting thereon the pixel circuit can be reduced compared to the dimensions of the substrate in the conventional organic EL display device, the MOSFETs in the pixel circuit can be fabricated at lower costs and with higher ratio of the number of non-defected products to the number of total products.

The above and other objects, features and advantages of the present invention will be more apparent from the following description, referring to the accompanying drawings.

PREFERRED EMBODIMENTS OF THE INVENTION

Figure 1:
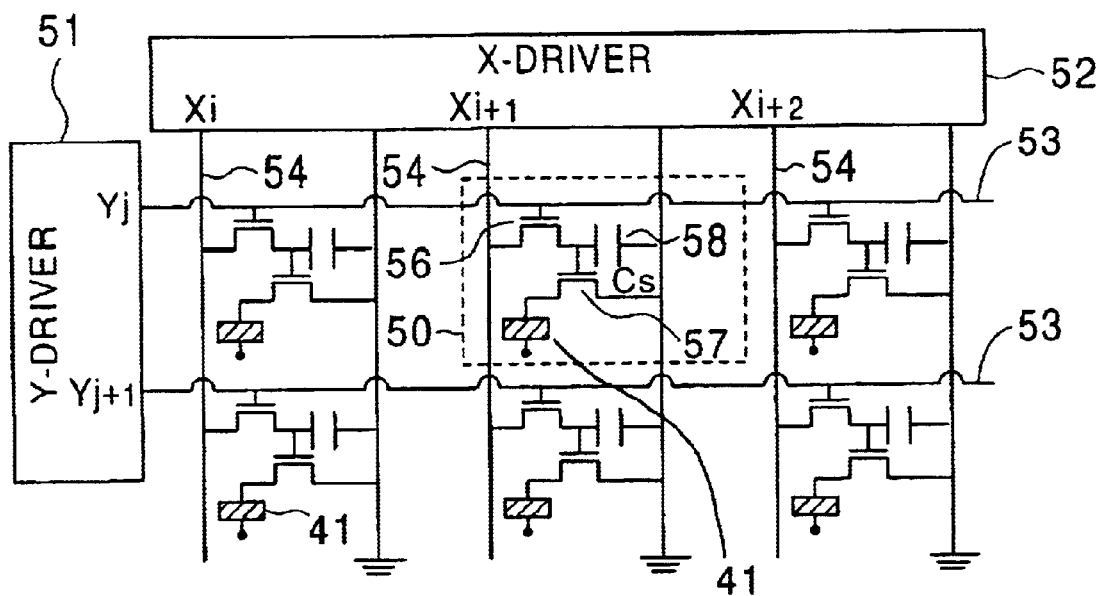
FIG. 1 is an equivalent circuit diagram of a general organic EL display device.
Figure 2:
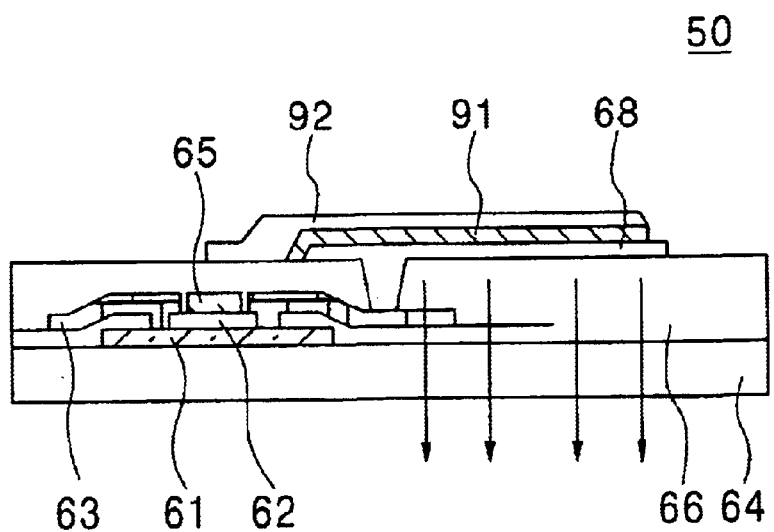
FIG. 2 is a sectional view of a conventional organic EL display device.
Figure 3:
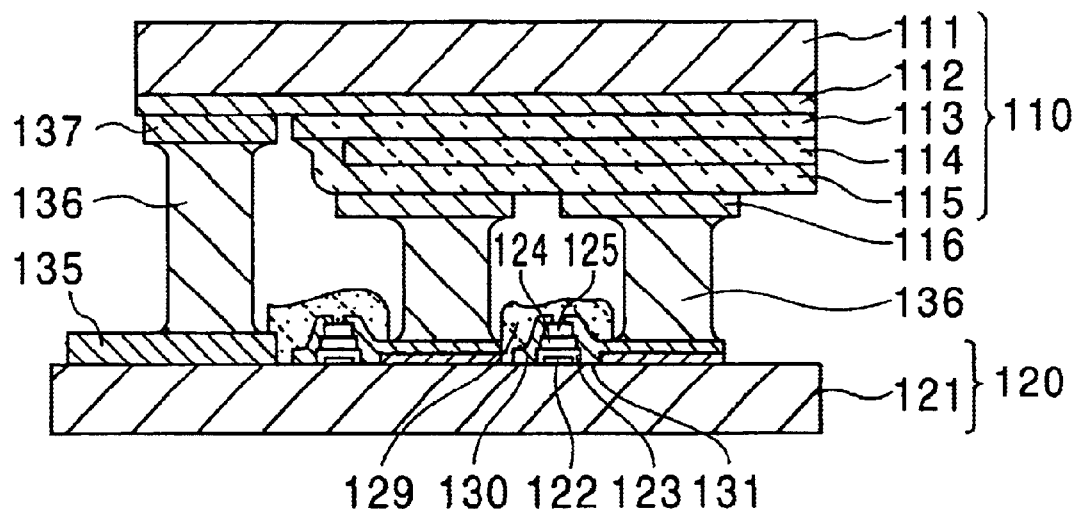
FIG. 3 is a sectional view of another conventional organic EL display device.
Figure 4:
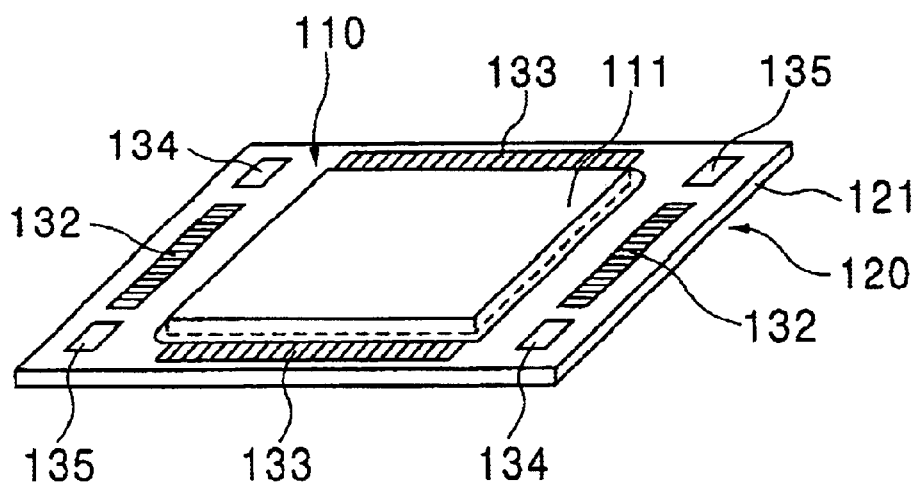
FIG. 4 is a schematic perspective view of the organic EL display device of FIG. 3.

Now, the present invention is more specifically described with reference to accompanying drawings, wherein similar constituent elements are designated by similar reference numerals.

An organic EL display device according to a first embodiment of the present invention has the circuit configuration described with reference to FIG. 1. The description of the general organic EL display device in the prior art of this text is incorporated herein by reference.

Figure 5:
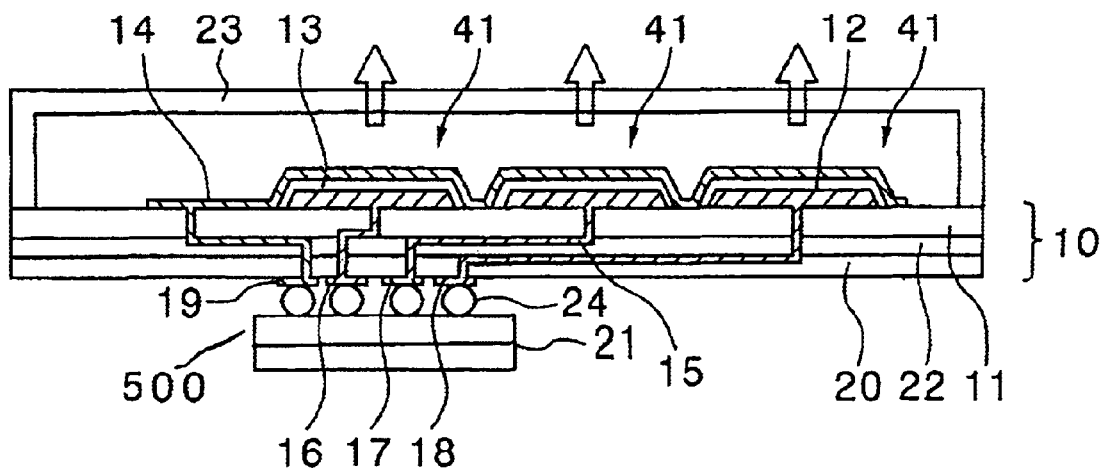
FIG. 5 is a sectional view of an organic EL display device according to a first embodiment of the present invention.

Referring to FIG. 5, the organic EL display device of the present embodiment includes a multilayer ceramic substrate 10, on which three pixel EL elements 41 of respective unit pixels are exemplarily depicted. The fabrication steps for the organic EL display device will be described below in addition to description of the structure thereof.

First, a metallic film such as Cu is deposited on the multilayer substrate 10, then subjected to patterning by etching etc. An Al film including Li therein is formed thereon by an evaporation or sputtering technique to form a cathode pattern including a cathode 12 in each of the pixel EL elements 41. An organic thin film 13 is then formed on each cathode 12. The organic thin film 13 may be a single-layer film or a multilayer film in the present invention. A blanket ITO anode (or common anode) 14 is then deposited on the entire surface including the surfaces of the organic thin films 13.

The cathodes 12 and the common anode 14 are connected to rear terminals 16 to 19, which are disposed on the rear surface of the multilayer substrate 10, through interconnects 15 and via holes formed in the multilayer substrate 10. The rear terminals 16 to 19 are connected to respective pads of a drive IC 21 by metallic bumps 24. The drive IC 21 is mounted on the second substrate 500 which is mounted to the rear surface of the substrate 40. An encapsulating cap 23 is bonded onto the front surface of the multilayer substrate 10 for encapsulating therebetween the pixel EL elements 41 of the unit pixels. The encapsulating cap 23 protects the organic thin film 13 in the pixel EL elements 41 against moisture.

In the above structure of the pixel EL elements 41 wherein the organic thin film 13 is sandwiched between the cathode 12 and the anode 14, when a voltage is applied between the anode 14 and the cathode 12 through respective terminals 26 to 29, electrons and holes are injected to the organic thin film 13, and the injected anode 14 and cathode 12 are recombined therein to emit light from each pixel EL element 41.

Figure 6:
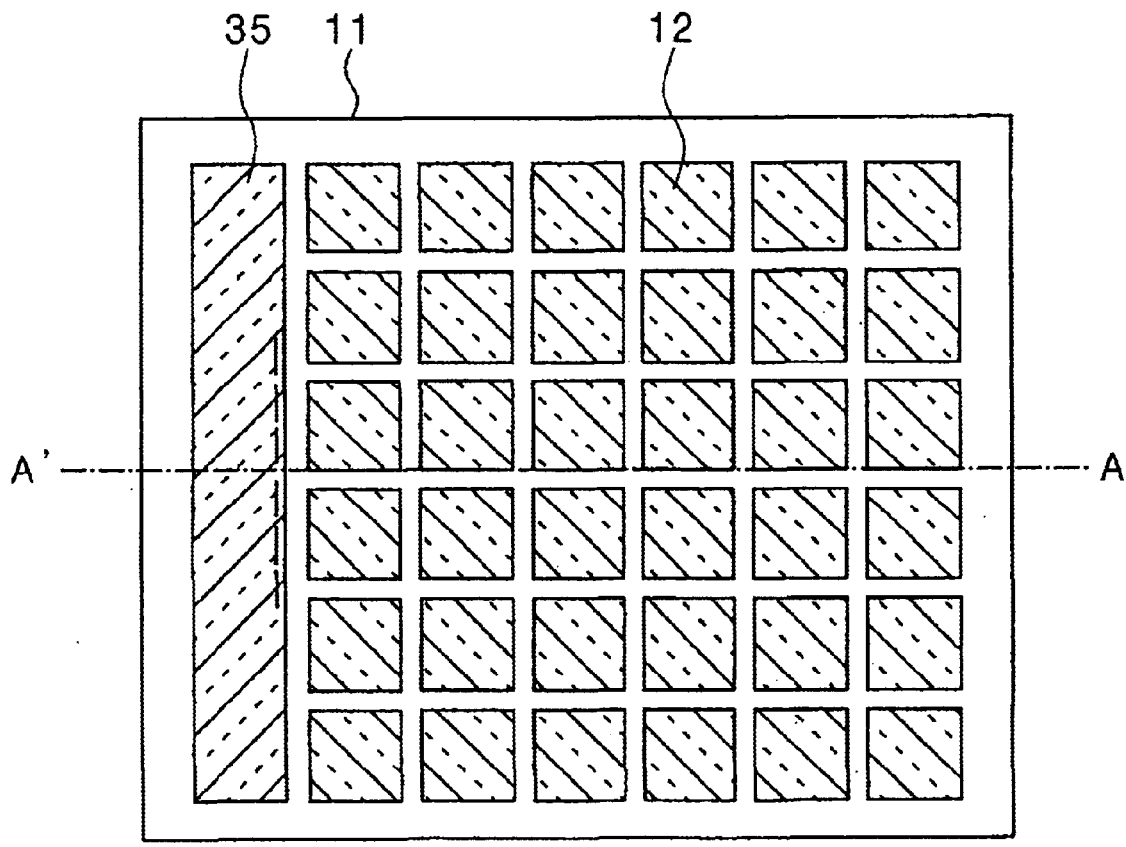
FIG. 6 is a top plan view of the first layer in the multilayer substrate shown in FIG. 5.
Figure 7:
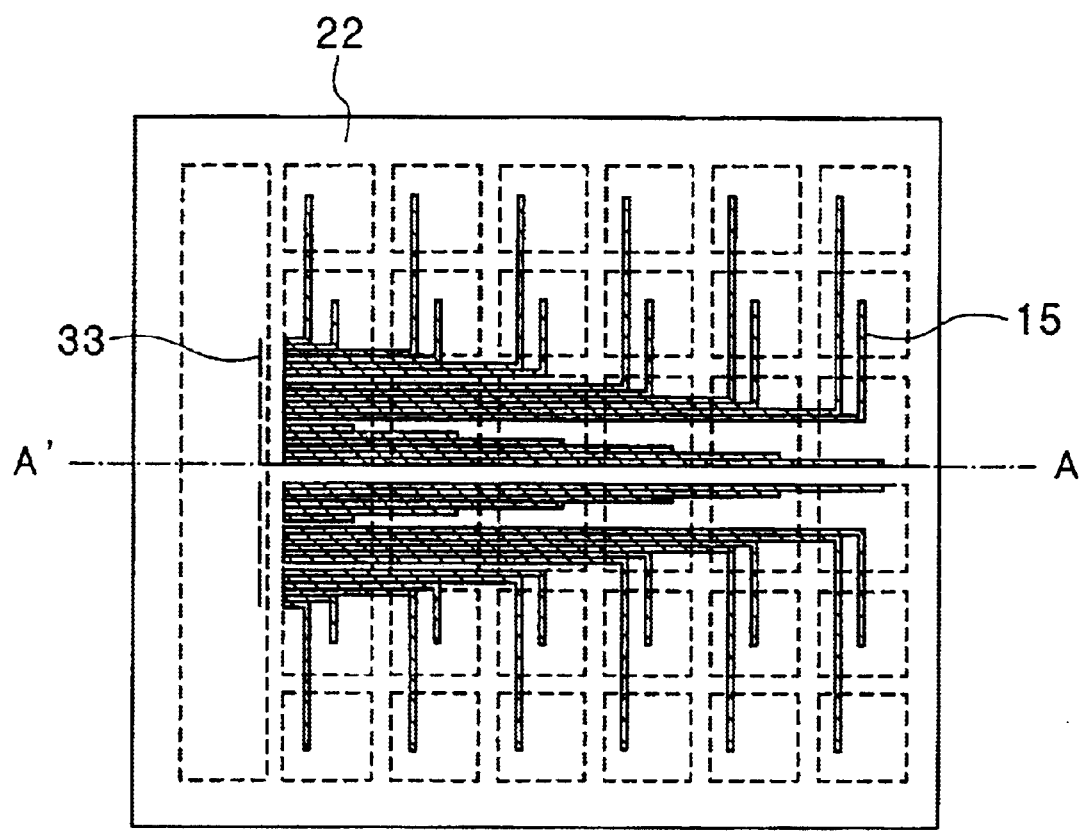
FIG. 7 is a top plan view of the second layer in the multilayer substrate shown in FIG. 5.
Figure 8:
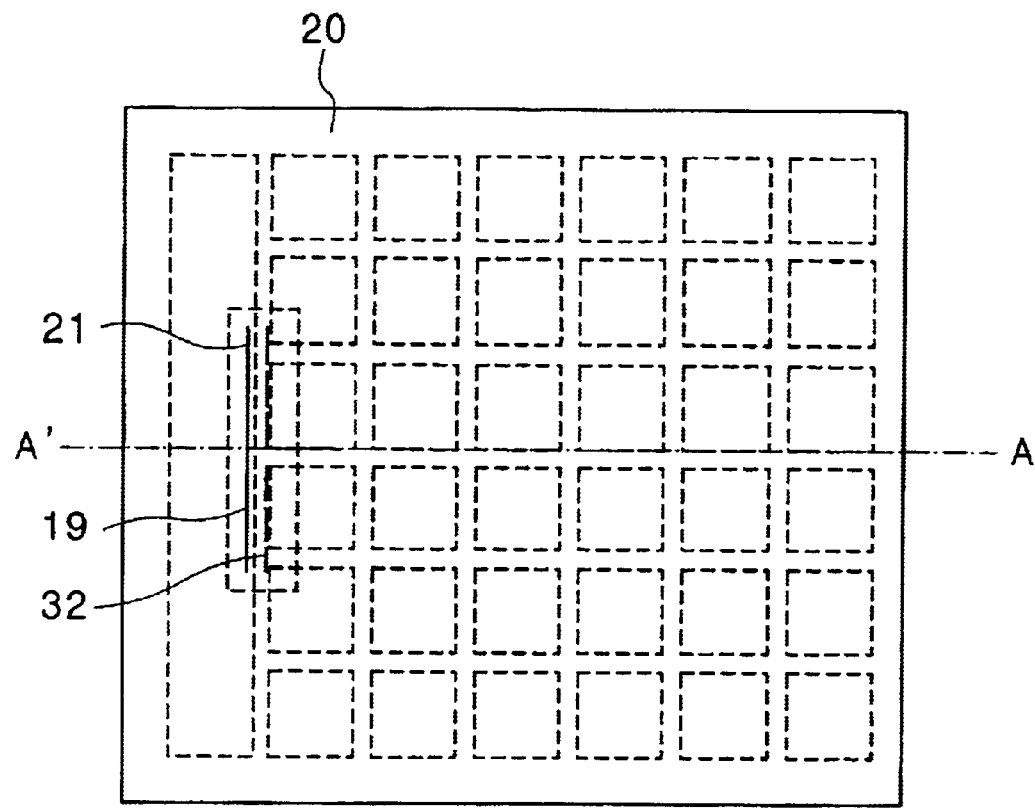
FIG. 8 is a top plan view of the third layer in the multilayer substrate shown in FIG. 5.

The multilayer substrate 10 in the present embodiment has a three-layer structure including first (front) ceramic layer 11, second (intermediate) ceramic layer 22 and third (rear) ceramic layer 20 shown in FIGS. 6 to 8, respectively.

In FIG. 6 wherein the first ceramic layer 11 is depicted by removing the anode 14 and the organic thin film 13, the cathode pattern includes a plurality of cathodes 12 arrayed in a matrix for defining a plurality of pixel areas. Each cathode 12 is connected to a corresponding rear terminal on the rear side of the multilayer substrate 10 through a via hole (not shown) formed in the first layer 11. A pad section 35 disposed for the anode 14 has a rectangular shape, and is connected to the rear terminal through a plurality of via holes formed in the multilayer substrate 10.

In FIG. 7, the second ceramic layer 22 mounts thereon interconnects 15, each of which extends on the second ceramic layer 22 and connects a via hole formed in the first layer 11 for a corresponding cathode 12 to a corresponding via hole formed in the second ceramic layer 22. Other via holes 23 are disposed for the anode 14.

In FIG. 8, the third ceramic layer 20 mounts interconnects (not shown) at the front surface thereof and mounts the drive IC 21 at the rear surface thereof. Via holes 32 are formed in the third layer 20 for the respective cathodes 12 in the pixel EL elements 41. As depicted in FIG. 8, the drive IC 21 has planar dimensions significantly smaller than the planar dimensions of the multilayer substrate 10 mounting thereon the pixel EL elements 41.

Figure 9:
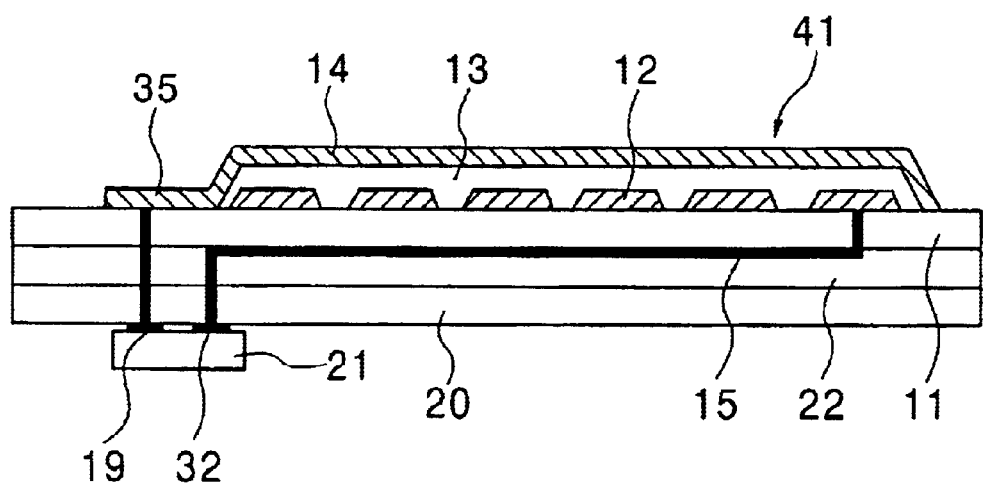
FIG. 9 is a sectional view taken along lines IX—IX in FIGS. 6 to 8.

Referring to FIG. 9, each cathode 12 in the pixel EL element 41 is connected to a corresponding rear terminal 32 which mounts thereon a corresponding electrode pad of the drive IC 21, whereas the anode 14 is common to all the pixel EL elements 41 and connected to a common rear terminal 19 which mounts thereon a corresponding electrode pad of the drive IC 21. The interconnect 15 extends on the top surface of one of the second and third ceramic layers 22 and 20. In the present embodiment, the area for the drive IC 21 is significantly below ½ and may be equal to about ¹⁄₁₀ of the area for the multilayer substrate 19.

Figure 10:
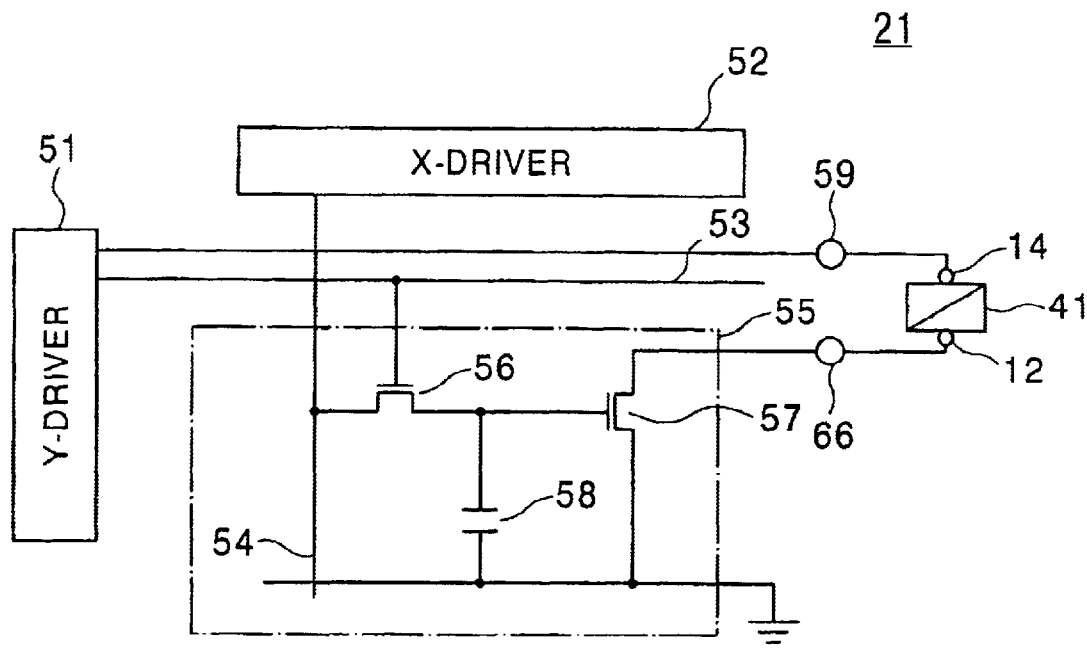
FIG. 10 is a circuit diagram of the drive IC in the organic EL display device of FIG. 5.

Referring to FIG. 10, the drive IC 21 includes a scan driver (Y-driver) 51 for consecutively activating a plurality of scan lines 53, a data driver (X-driver) 52 for supplying display data to a plurality of data lines 54, and a plurality of pixel circuits 55 each disposed for a corresponding one of pixel EL elements 41 and including a first MOSFET 56, a second MOSFET 57 and a storage capacitor 58.

The first MOSFET 56 has a gate connected to a corresponding scan line 53, a drain connected to a corresponding data line 54 and a source connected to the gate of the second MOSFET 57. The second MOSFET 57 has a source connected to the ground and a drain connected to the cathode of a corresponding pixel EL element through a terminal 60. The storage capacitor 58 is connected between the source of the first MOSFET 56 and the ground for storing electric charge for the unit pixel. The pixel EL element 41 in FIG. 5 is connected between the source terminal 59 and the drain of the second MOSFET 57 through the terminal 60.

In operation of the organic EL display device of the present embodiment, display data is supplied to each pixel circuit 55 as a voltage signal. This is achieved by raising the potential of the corresponding scan line 53 to a high level to turn on the first MOSFET 56 while supplying the display data through the data line 54 and the first MOSFET 56 to the storage capacitor 58. After the potential of the scan line 53 is lowered to a low level, the first MOSFET 56 is turned off, whereby the data is stored on the storage capacitor 58 as an electric charge until next turn on of the first MOSFET 56. The second MOSFET 57 draws or sinks a current corresponding to the stored electric charge from the pixel EL element through the terminal 60 to the ground. The sink of the current continues so long as the storage capacitor 58 stores the electric charge corresponding to the display data, thereby driving the pixel EL element 41 formed on the multilayer substrate 10, The sink of the current from the pixel EL element 41 causes injection of electrons and holes in the organic thin film 13 in the pixel EL element 41 and recombination of the electrons and holes in the organic thin film 13. The recombination generates an electroluminescence or light emission corresponding to the recombination rate between the electrons and holes.

In the present embodiment, the drive IC 21 including a pixel circuits 55 is fabricated on a silicon substrate separately from the pixel EL elements 41 which are formed on the multilayer substrate 10. The drive IC 21 has smaller dimensions compared to the multilayer substrate 10, which affords reduction in the irregularity of the transistor characteristics in the MOSFETs 56 and 57 in the pixel circuit 55 caused by the process 12 conditions and raises the ratio of the number of non-defective products to the number of the total products.

In addition, since the first and second MOSFETs 56 and 57 need not be TFTs and can be formed on a single-crystalline silicon substrate, a larger transistor size by twice to ten times, for example, compared to the conventional transistor size can be obtained for the MOSFETs. In other word, a similar transistor size, if employed, reduces the occupied area for the drive IC. This reduces irregularity of the transistor characteristics in the MOSFETs 56 and 57 in the pixel circuit 55 and thus further improves the ratio of the number of nondefective products to the number of total products. Furthermore, the irradiation characteristics of the organic EL display device can be improved by employment of the single-crystalline silicon substrate.

Figure 11:
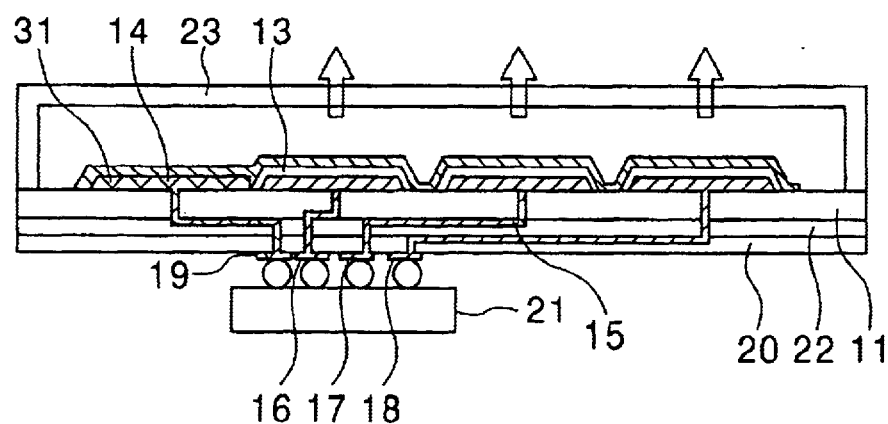
FIG. 11 is a sectional view of an organic EL display device according to a second embodiment of the present invention.

Referring to FIG. 11, an organic EL display device according to a second embodiment of the present invention is similar to the first embodiment except that the anode 14 is connected to the rear terminals 19 through an underlying electrode film 31 which is formed as a common layer with the cathodes 12. This configuration in the present embodiment prevents a disconnection failure caused due to a step structure in the anode 14, which may occur depending on the fabrication process in the first embodiment. The thickness of the underlying electrode film 31 for the anode 14 may have a thickness equal to the thickness of the cathode 12 or the total thickness of the cathode 12 and the organic film 13.

Since the above embodiments are described only for examples, the present invention is not limited to the above embodiments and various modifications or alterations can be easily made therefrom by those skilled in the art without departing from the scope of the present invention.

What is claimed is:

1. An active-matrix-driven organic electroluminescence (EL) display device comprising:

first and second substrates;

a plurality of unit pixels each including a pixel EL element and a pixel circuit, said pixel EL elements being arranged in a matrix on a front surface of said first substrate;

a plurality of scan lines each disposed for a corresponding row of said unit pixels;

a plurality of data lines each disposed for a corresponding column of said unit pixels;

a drive circuit for driving said scan lines and said data lines to activate said pixel EL elements through respective said pixel circuits;

wherein said drive circuit, including said scan lines, said data lines and said pixel circuits, is mounted on said second substrate;

wherein said drive circuit and said second substrate are mounted at a rear surface of said first substrate; and wherein said second substrate is connected to said first substrate through bumps formed on rear terminals located on said rear surface of said first substrate.

2. The active-matrix-driven organic EL display device as defined in claim 1, wherein said first substrate is a multilayer substrate.

3. The active-matrix-driven organic EL display device as defined in claim 1, wherein electrodes of said pixel EL element are connected to said rear terminals through via holes formed in said first substrate.

4. The active-matrix-driven organic EL display device as defined in claim 3, wherein said pixel EL element has an anode common to all the pixel EL elements.

5. The active-matrix-driven organic EL display device as defined in claim 1, wherein said second substrate is a silicon substrate.

6. The active-matrix-driven organic EL display device as defined in claim 1, wherein said first substrate has a larger planar size compared to a planar size of said second substrate.

7. A method for fabricating an active-matrix-driven organic EL display device comprising the steps of:

forming a plurality of cathodes on a front surface of a first substrate;

forming an organic thin film on each of said cathodes;

forming a common anode on said organic thin films;

forming on a rear surface of said first substrate a plurality of rear electrodes connected to said anode and said cathodes through via holes and interconnects formed in said first substrate;

using bumps formed on rear terminals, said terminals connected to said rear surface of said first substrate to mount a second substrate on said rear surface of said first substrate;

mounting on said second substrate a drive IC that includes a drive circuit and a plurality of pixel circuits each corresponding to one of said pixel EL elements; and using said drive circuit to drive said pixel EL elements through said respective pixel circuits.

8. The method as defined in claim 7, wherein said pixel circuit includes first and second MOSFETs and a storage capacitor.

* * * * *